United States Patent
Liu et al.

(10) Patent No.: US 11,143,686 B2
(45) Date of Patent: Oct. 12, 2021

(54) METHOD FOR DETECTING POWER DISTRIBUTION NETWORK EARLY FAILURE

(71) Applicant: Shanghai Jiao Tong University, Shanghai (CN)

(72) Inventors: Yadong Liu, Shanghai (CN); Siheng Xiong, Shanghai (CN); Zihan Cong, Shanghai (CN); Lingen Luo, Shanghai (CN); Xiuchen Jiang, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 69 days.

(21) Appl. No.: 16/674,233

(22) Filed: Nov. 5, 2019

(65) Prior Publication Data

US 2020/0209300 A1 Jul. 2, 2020

Related U.S. Application Data

(63) Continuation of application No. PCT/CN2019/078575, filed on Mar. 19, 2019.

(30) Foreign Application Priority Data

Dec. 27, 2018 (CN) .......................... 201811607507.8

(51) Int. Cl.
*G01R 31/08* (2020.01)
*G01R 31/58* (2020.01)
*G01R 19/25* (2006.01)

(52) U.S. Cl.
CPC ....... *G01R 31/088* (2013.01); *G01R 19/2513* (2013.01); *G01R 31/08* (2013.01);
(Continued)

(58) Field of Classification Search
CPC .. G01R 31/088; G01R 31/58; G01R 19/2513; G01R 31/086; G01R 31/08; Y04S 10/52
See application file for complete search history.

(56) References Cited

U.S. PATENT DOCUMENTS

2013/0038123 A1* 2/2013 Wilkins .............. H02J 13/0079
307/18

FOREIGN PATENT DOCUMENTS

| CN | 103091096 A | 5/2013 |
| CN | 104122486 A | 10/2014 |

(Continued)

*Primary Examiner* — Melissa J Koval
*Assistant Examiner* — Joseph O Nyamogo
(74) *Attorney, Agent, or Firm* — Mei & Mark LLP; Manni Li

(57) ABSTRACT

Power distribution network early failure detection method comprising: a waveform is decomposed into an approximation part and detail parts by wavelet transform, wherein the approximation part is referred to as an approximate shape primitive, and the detail parts are referred to as distortion primitives; the distortion primitives are divided into three primitives including harmonics, pulses and other distortions based on extreme points; characteristics of the primitives and time relationships between the primitives are extracted; probability distribution of the waveform is constructed according to the characteristics of the primitives and the time relationships between the primitives; and a judgment result of the waveform is obtained according to probability distribution of waveforms of different types.

9 Claims, 4 Drawing Sheets

(52) U.S. Cl.
CPC ........... *G01R 31/086* (2013.01); *G01R 31/58* (2020.01); *Y04S 10/52* (2013.01)

(56) References Cited

FOREIGN PATENT DOCUMENTS

| | | | |
|---|---|---|---|
| CN | 107025433 | A | 8/2017 |
| CN | 107329049 | A | 11/2017 |
| CN | 107340456 | A | 11/2017 |

\* cited by examiner

METHOD FOR DETECTING POWER DISTRIBUTION NETWORK EARLY FAILURE

CROSS-REFERENCE TO RELATED APPLICATIONS

The subject application is a continuation of PCT/CN2019/078575 filed on Mar. 19, 2019, which in turn claims priority on Chinese Application No. 201811607507.8 filed on Dec. 27, 2018 in China. The contents and subject matter of the PCT international application and the Chinese priority application are incorporated herein by reference.

TECHNICAL FIELD

The present invention relates to early failure detection for power distribution networks, particularly, a power distribution network early failure detection method based on human-level concept learning.

BACKGROUND ART

Reliability of the power supply is the most important evaluation index for power distribution networks. Due to large quantity of equipments and wide distribution area of power distribution networks, operation and maintenance of power distribution networks mainly focus on treatments after failure, such as failure location, failure isolation, and failure recovery. However, as requirements on reliability of the power supply of the state and electricity market become higher, failure treatment of distribution networks should focus on not only power supply recovery after failure, but also equipment early-warning before failure, and change the work mode of failure treatment from "repair and inspection after failure" to "active treatment of early warning before failure" so as to eliminate permanent failures before they occur, and greatly reduce the probability of power failure accidents caused by equipment failures.

Before equipment failures, there are often some abnormal precursory signals, which are referred to as early failures. Early failure detection, as a mode of power state detection, provides a new idea for operation and maintenance of the distribution network, so that defective equipment can be replaced in advance, and reliability of the power supply is improved. Meanwhile, the workload of operation and maintenance is reduced, and the cost is saved.

Early failures often occur repeatedly with short duration. Such self-healing failures are often accompanied by arcing, causing damages to insulators and conductors. Moreover, insulator damages can cause more failures. As a result, such failures often occur repeatedly until a permanent failure develops. The cause of early failures relates to the type of equipment. In cables, the aging of insulators is the major cause of early failures. In overhead lines, various non-electrical factors such as wind, animal contacts, branch contacts, etc., often cause early failures. In other electrical devices, insulator defects and poor contact can also cause early failures.

Early failure detection is mainly divided into model-driven type and data-driven type. The model-driven type is often limited to a single model and cannot adapt to complex actual conditions, so that data-driven methods are often used. Conventional data-driven methods require a large amount of data and are often only directed to individual scenarios, thus requiring improvements. Human-level concept learning simulates a process that people observes a waveform where the waveform is decomposed and reconstructed according to the result of decomposition, and performs waveform recognition by learning the process. However, how to apply human-level concept learning to early failure diagnosis of power distribution networks is still a problem to be solved in the art.

At present, no description or report for technologies similar to the present invention has been found, and no similar materials at home or abroad have been collected.

SUMMARY OF THE INVENTION

To overcome the defects in the current technology, the present invention introduces theories and provides methods related to human-level concept learning into early failure diagnosis of power distribution networks, provides a power distribution network early failure detection method based on human-level concept learning for early failure detection of power distribution networks through theoretical analysis, and proves the validity of the method. Human-level conceptual learning simulates a process that people recognizes a waveform in which the waveform is decomposed into different components to be superposed, and performs waveform recognition by learning time relationships between the components. Compared with conventional algorithms, the power distribution network early failure detection method based on human-level concept learning provided by the present invention has the features that prior knowledge can be introduced, less samples are required, and high accuracy is achieved.

The present invention is realized by the following technical scheme.

A power distribution network early failure detection method that is based on human-level concept learning comprises the following steps:

S1: decomposing a waveform into an approximation part and detail parts by wavelet transform, wherein the approximation part is referred to as an approximate shape primitive, and the detail parts are referred to as distortion primitives;

S2: dividing the distortion primitives into three primitives including harmonics, pulses and other distortions based on extreme points;

S3: extracting characteristics of the primitives and time relationships between the primitives;

S4: constructing probability distribution of the waveform according to the characteristics of the primitives and the time relationships between the primitives; and S5: obtaining a judgment result of the waveform according to probability distribution of waveforms of different types.

Preferably, in S1, a five-level Meyer function is selected as a wavelet transform function, the approximate shape takes a coefficient $a_5$, and the distortions take a difference between the original waveform and the coefficient $a_5$.

Preferably, in S2, the distortions are decomposed, a distortion curve is split into a plurality of segments according to the extreme points in the distortion curve, and each segment is combined with neighboring segments to form the three primitives including harmonics, pulses and other distortions.

Preferably, each segment is combined with neighboring segments according to rules that:

three or more neighboring segments, which are monotonic in reverse directions and differ in a range of 0.8 to 1.2 times in both amplitude and length of time, form a harmonic;

two neighboring segments, which are monotonic in reverse directions and have an amplitude larger than a threshold and a length of time less than a threshold, form a pulse; and segments which do not form harmonics and pulses are other distortions.

Preferably, the threshold for the amplitude is set as 0.5 time as large as a fundamental amplitude; and a threshold for the length of time is set as 0.25 time as long as a fundamental cycle.

Preferably, in S3, the characteristics of the primitives are extracted according to principles that:

for an approximate shape $z_o$, an amplitude $A_o$, a length of time $T_o$ and a direct-current component $A_{off}$ of each cycle are extracted; for a harmonic $z_h$, an amplitude $A_h$, a frequency $f_h$ and a total length of time $t_h$ are extracted; for a pulse $z_p$, an amplitude $A_P$ and a pulse width $t_p$ are extracted; and for other distortions $z_{other}$, no characteristics are extracted.

Preferably, in S3, the time relationships between the primitives include time relationships between the approximate shape and the distortions and time relationships between the distortions; wherein:

the time relationship between the approximate shape and each distortion is referred to as a relative fundamental position $P_o$, and the relative fundamental position $P_o$ indicates a position where the distortion is located on the approximate shape at an initial moment and is represented by a phase angle;

the time relationships between the distortions include:
an interval time $t_{int}$ indicating a time interval between two neighboring distortions;
a single-phase primitive pair $PP_{uni}$ indicating two distortions having same or approximate initial moments in same-phase voltage or current waveforms; and
a three-phase primitive pair $PP^{tri}$ indicating three distortions having same or approximate initial moments in three-phase voltage or current waveforms.

Preferably, in the time relationships between the approximate shape and the distortions and the time relationships between the distortions, the time relationships associated with the other distortions are ignored.

Preferably, in S4, the probability distribution of the waveform is constructed according to a formula of:

$$P(\theta_w^x \mid \psi_w) = P(\mu^{(x)})P(\sigma^{(x)})P(\kappa^{(x)} \mid \kappa)\prod_i^{\kappa} P(z_i^{(x)} \mid z_i)P(p_i^{(x)} \mid p_i)P(R_i^{(x)} \mid R_i)$$

wherein, $\theta_w^x$ is an unknown waveform case, $\psi_w$ is a known waveform type, noises obey normal distribution $S_N\sim N(\mu, \sigma_2)$, $\kappa$ is the number of the primitives, $z=\{z_o,z_h,z_p,z_{other}\}$ is the primitive types, p is characteristic parameters of the primitives, and R is the time relationships between the primitives;

three-phase currents recorded in an abnormal event of a power distribution network are summed to obtain a neutral point current to generate seven waveforms ($I_A,I_B,I_C,I^N,U_A,U_B,U_C$) of different types, and probability distribution of the abnormal event in the waveforms of different types is obtained according to a formula of:

$$P(\theta_E^x \mid \psi_E) = \prod_{i=1}^{7} P(\theta_{wi}^x \mid \psi_{wi})$$

wherein, $\theta_E^x$ is an unknown event case, $\psi_E$ is a known event type, and w=$\{I_A,I_B,I_C,I_N,U_A,U_B,U_C\}$ is the waveforms.

Preferably, in S5, a type of the abnormal event is judged according to the probability distribution of the abnormal event in the waveforms of different types, i.e. values of $P(\theta_E^x|\psi_E)$ in waveforms of different types are compared and a waveform type corresponding to a maximum value is taken to obtain the judgment result of the waveform.

Compared with the current technology, the present invention has the following advantages:

according to the power distribution network early failure detection method based on human-level concept learning, theories and methods related to human-level concept learning are introduced into early failure diagnosis of power distribution networks, a detection algorithm for early failure detection of power distribution networks is provided through theoretical analysis, and validity of the algorithm is proved. Voltage and current waveforms, as one of visual concepts, are decomposed into an approximate shape and various distortions, and the overall probability distribution of the waveform can be obtained by calculating probability distribution of each component so as to judge the type of the waveform. The power distribution network early failure detection method based on human-level concept learning, provided by the invention, is significantly advanced to conventional detections in terms of required data volume and accuracy, and is of great significance in detection and processing of early failures of power distribution networks.

BRIEF DESCRIPTION OF THE DRAWINGS

Features, objects, and advantages of the present invention are explained in the detailed description in the following nonlimiting embodiments with reference to the accompanying drawings.

FIG. 3A is a schematic diagram showing the definition of time relationships between an approximate shape and distortions, and FIG. 3B is a schematic diagram showing the definition of time relationships between distortions.

DETAILED DESCRIPTION OF THE INVENTION

Embodiments of the present invention are described in details below: the embodiment is implemented based on the technical scheme of the present invention, and detailed implementation and a specific operation process are provided. It should be noted that several variations and modifications may be made by those skilled in the art without departing from the spirit of the present invention, all of which fall within the scope of the present invention.

Embodiment

Figure 5:
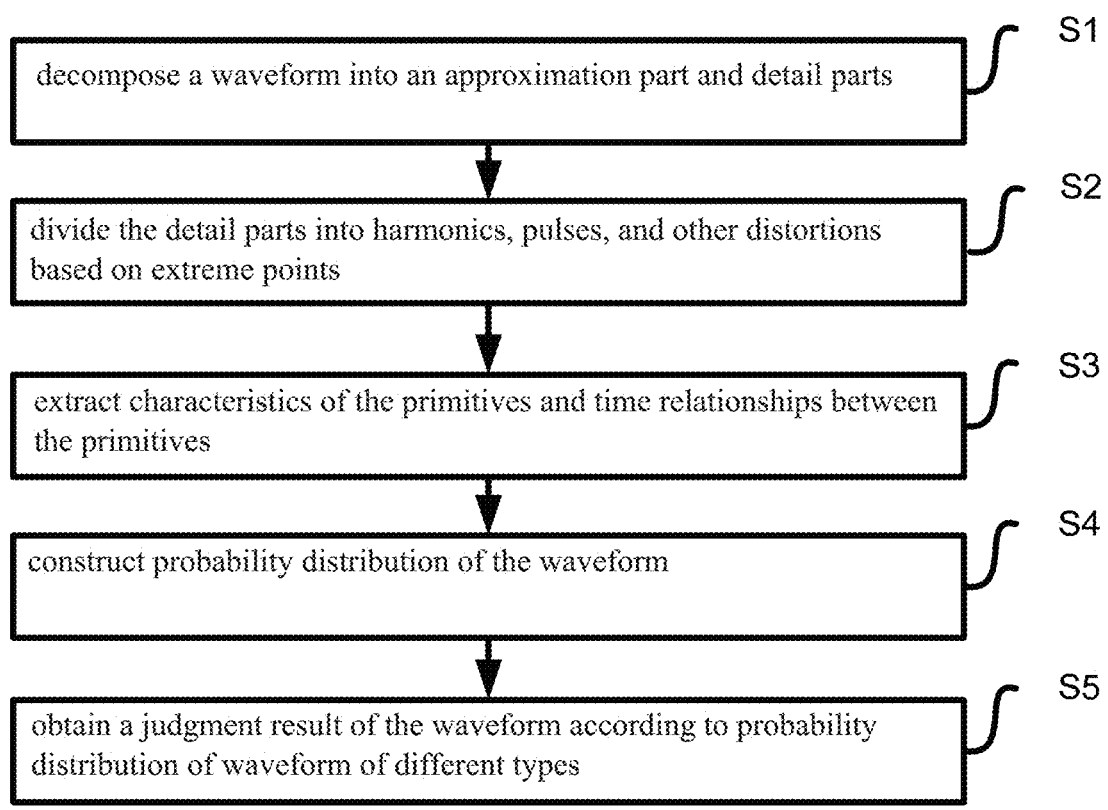
FIG. 5 is a flowchart showing the human-level concept learning-based power distribution network early failure detection method according to one embodiment of the present invention.

As shown in FIG. 5, the embodiment of the invention provides a power distribution network early failure detection method based on human-level concept learning, comprising the following steps:

Step S1: a waveform is decomposed into an approximation part and detail parts by wavelet transform, wherein the approximation part is referred to as an approximate shape primitive, and the detail parts are referred to as distortion primitives.

Step S2: the distortions (the detail parts) are divided into three primitives including harmonics, pulses and other distortions based on extreme points.

Step S3: characteristics of the primitives and time relationships between the primitives are extracted.

Step S4: probability distribution of the waveform is constructed according to the characteristics of the primitives and the time relationships between the primitives.

Step S5: a judgment result of the waveform is obtained according to probability distribution of waveforms of different types.

The technical scheme of the above embodiment of the present invention will be further described in detail below with reference to the accompanying drawings.

Figure 1:
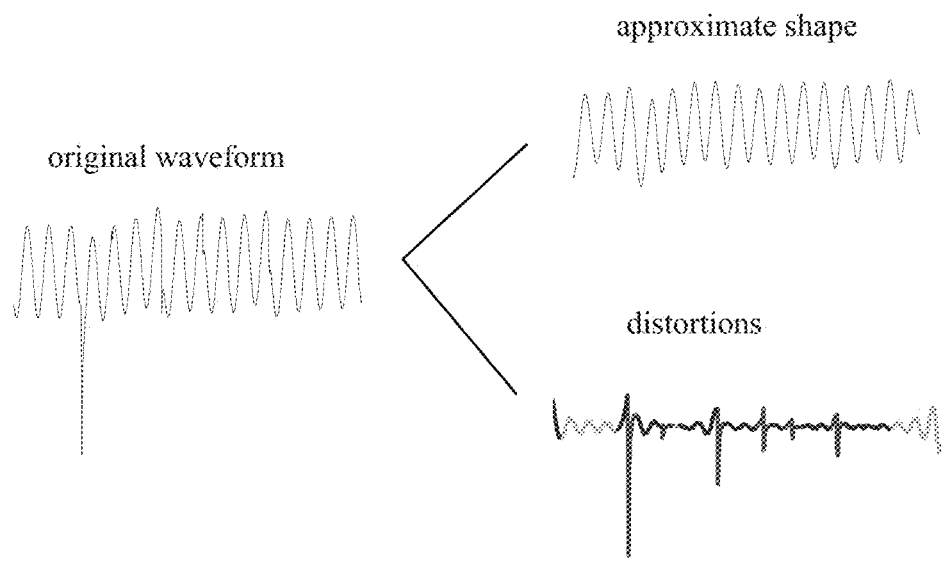
FIG. 1 is a schematic diagram showing the waveform decomposition in one embodiment of the present invention.
Figure 2:
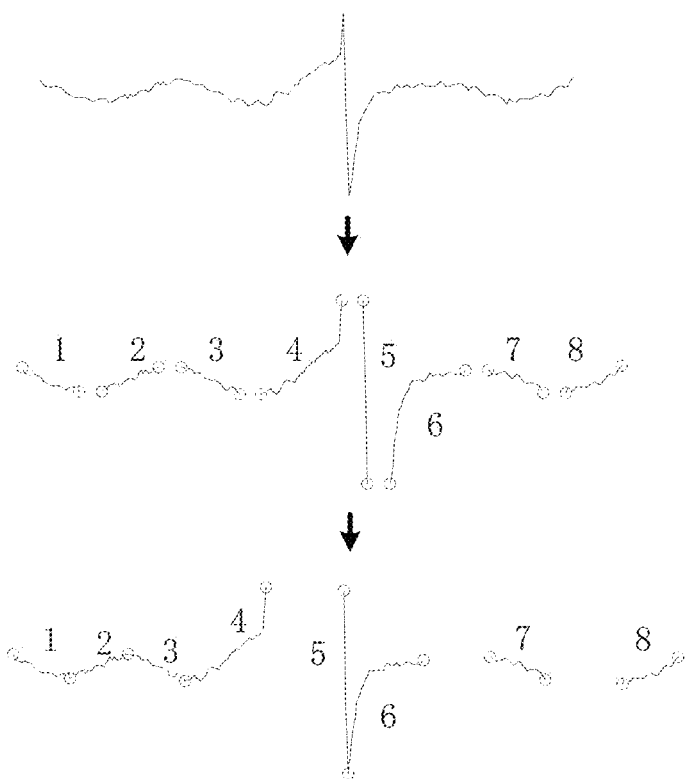
FIG. 2 is a schematic diagram showing the distortion decomposition in one embodiment of the present invention.

As shown in FIG. 1 which is a waveform decomposition schematic diagram of wavelet decomposition on an original waveform, a five-level Meyer function is selected as a wavelet transform function, the approximate shape takes a coefficient $a_5$, and the distortions take a difference between the original waveform and the coefficient $a_5$, thereby obtaining a decomposition result as shown in FIG. 1. The distortions (the detail parts) in FIG. 1 are then decomposed, a distortion curve is split into segments according to the extreme points in the distortion curve, as shown in the first step of FIG. 2, and each segment is combined with neighboring segments to form the three primitives including harmonics, pulses and other distortions, as shown in the second step of FIG. 2. The combination rules are as follows: (1) three or more neighboring segments, which are monotonic in reverse directions and differ slightly in both amplitude and length of time, form a harmonic (a combination of segments 1, 2, 3 and 4 as shown in FIG. 2); (2) two neighboring segments, which are monotonic in reverse directions and have an amplitude larger than a threshold (which is set as 0.5 time as large as a fundamental amplitude herein) and a length of time less than a threshold (which is set as 0.25 time as long as a fundamental cycle herein), form a pulse (a combination of segments 5 and 6 as shown in FIG. 2); and (3) segments which do not form harmonics and pulses are referred to as other distortions (segments 7 and 8 as shown in FIG. 2). The approximate shape, harmonics, pulses and other distortions are collectively referred to herein as primitives.

Figure 3A:
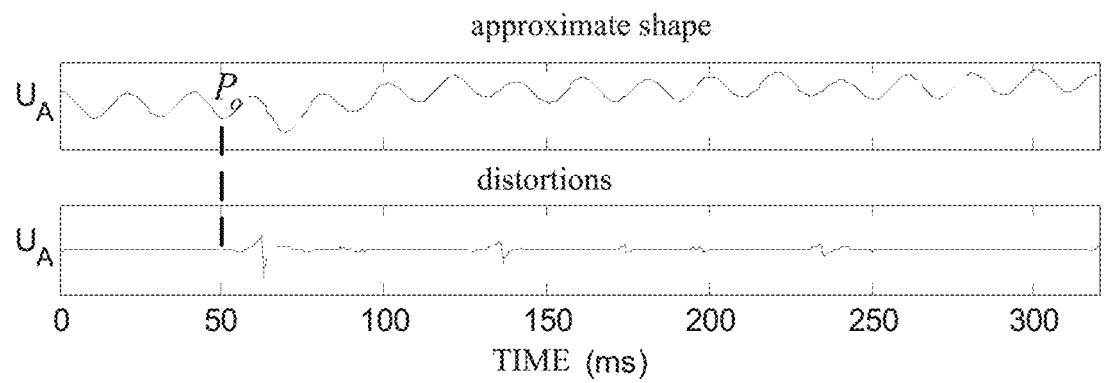
FIGS. 3A and 3B are schematic diagram showing definition of time relationships between primitives according to one embodiment of the present invention, where
Figure 3B:
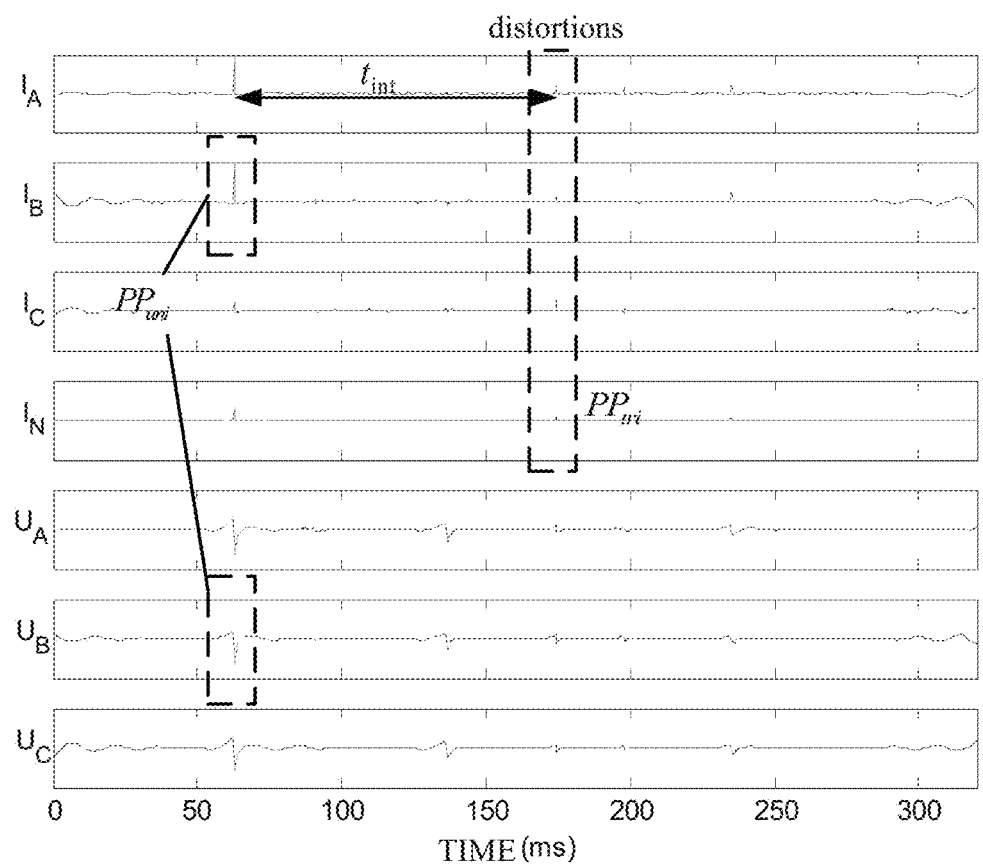

The characteristics of the primitives are extracted as follows: for an approximate shape $z_o$, an amplitude $A_o$, a length of time $T_o$ and a direct-current component $A_{oft}$ of each cycle are extracted; for a harmonic $z_h$, an amplitude $A_h$, a frequency $f_h$ and a total length of time $t_h$ are extracted; for a pulse $z_p$, an amplitude $A_p$ and a pulse width $t_p$ are extracted; and for other distortions $z_{other}$, which are not much associated with early failures, no characteristics are extracted. There are also time relationships between the primitives, the primitives can be divided into two types: the approximate shape and distortions (harmonics, pulses and other distortions), and the time relationships between the primitives can also be divided into time relationships between the approximate shape and the distortions and time relationships between the distortions. Similarly, time relationships associated with the other distortions $z_{other}$ are not discussed. The time relationship between the approximate shape and each distortion is referred to as a relative fundamental position $P_o$, and $P_o$ indicates a position where the distortion primitive is located on the approximate shape at an initial moment and is represented by a phase angle. The time relationships between the distortion primitives include: an interval time $t_{int}$, a single-phase primitive pair $PP_{uni}$ and a three-phase primitive pair $PP_{tri}$. $t_{int}$ indicates a time interval between two neighboring distortion primitives. The single-phase primitive pair $PP_{uni}$ indicates two distortion primitives having same/approximate initial moments in same-phase voltage or current waveforms. The three-phase primitive pair $PP_{tri}$ indicates three distortion primitives having same/approximate initial moments in three-phase voltage/current waveforms. $PP_{uni}$ and $PP_{tri}$ are used for describing an association relationship, and the quantities of $PP_{uni}$ and $PP_{tri}$ are represented by $n_{uni}, n_{tri}$, respectively. Schematic diagrams of the above time relationships are as shown in FIGS. 3A and 3B.

Figure 4:
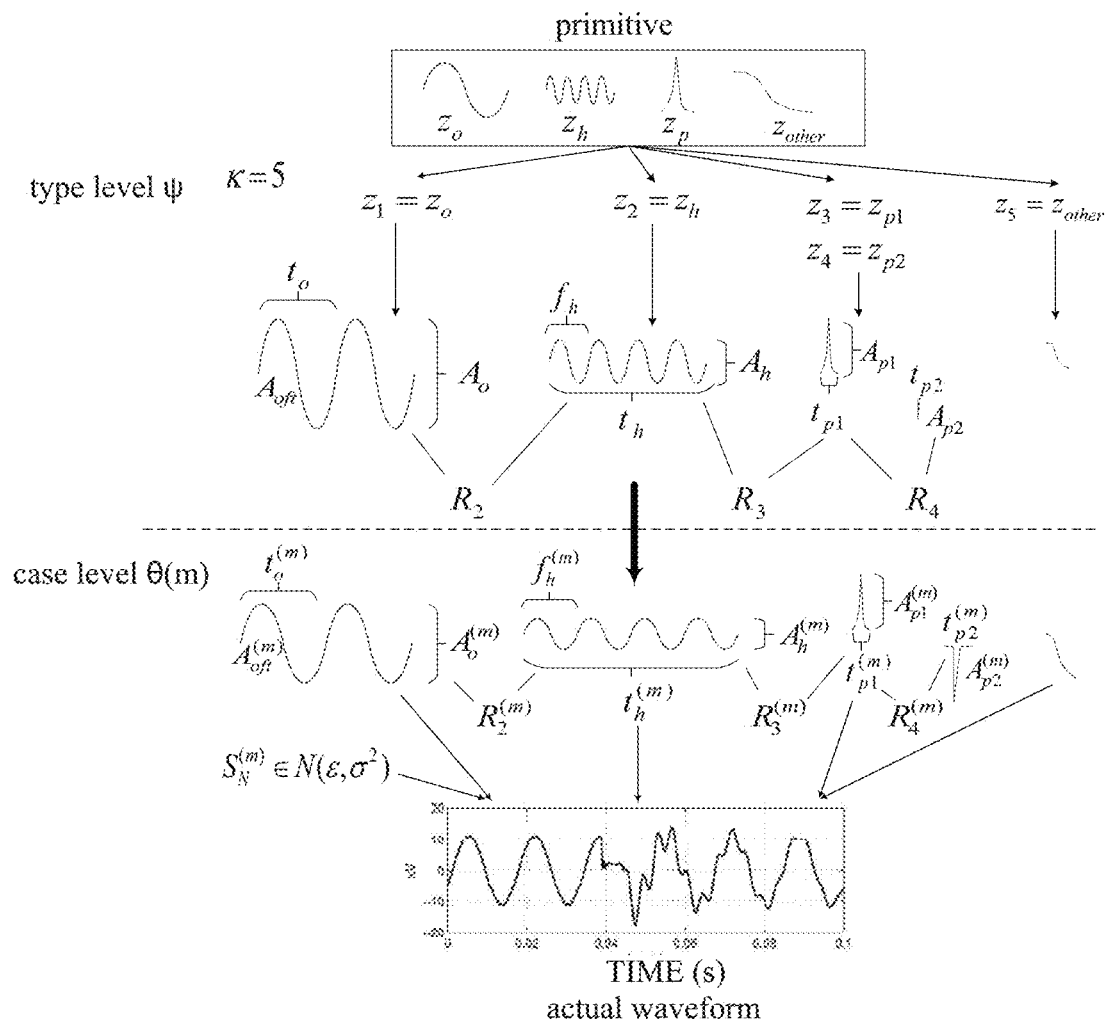
FIG. 4 is a schematic diagram showing the waveform generation process in one embodiment of the present invention.

Thus, a waveform is uniquely decomposed into a combination of the above primitives, and the characteristics of the primitives and the time relationships between the primitives are used for describing such combination. Next, a waveform generation process is provided based on the above decomposition as shown in FIG. 4. The process is described as follows: firstly, a plurality of primitives are selected from a primitive library (there are four primitive types, and the number of primitives in each type is arbitrary), wherein each primitive has respective characteristic parameters; the primitives are combined into a waveform in a sequential order that constitutes the time relationships between the primitives. The above-mentioned belongs to a type level. The type of a waveform is determined by failure causes, failure equipment and failure location. In actual situations, waveforms of the same type are affected by line parameters, grid structure, load conditions, sensor parameters, noises, etc., and appear as different cases. What shows in a primitive level is: the characteristic parameters of the primitives and the time relationships between the primitives may get changed, and meanwhile noises may be introduced. The above-mentioned belongs to a case level.

According to the above generation process in the embodiment of the present invention, a formula for probability distribution of the waveform can be derived as follows:

$$P(\theta_w^x | \psi_w) = P(\mu^{(x)})P(\sigma^{(x)})P(\kappa^{(x)} | \kappa) \prod_i^\kappa P(z_i^{(x)} | z_i) P(p_i^{(x)} | p_i) P(R_i^{(x)} | R_i)$$

wherein, $\theta_w^x$ is an unknown waveform case, $\psi_w$ is a known waveform type, noises obey normal distribution $S_N \sim N(\mu, \sigma^2)$, $\kappa$ is the number of the primitives, $z=\{z_o, z_h, z_p, z_{other}\}$ is the primitive types, p is the characteristic parameters of the primitives, and R is the time relationships between the primitives.

For an abnormal event in a distribution network, three-phase voltages and three-phase currents corresponding to the abnormal event are often recorded, and the three-phase currents are summed to obtain a neutral point current to generate seven waveforms $(I_A, I_B, I_C, I_N, U_A, U_B, U_C)$ of different types. Therefore, probability distribution of the abnormal event in the waveforms of different types is as follows:

$$P(\theta_E^x | \psi_E) = \prod_{i=1}^{7} P(\theta_{wi}^x | \psi_{wi})$$

wherein, $\theta_E^x$ is an unknown event case, $\psi_E$ is a known event type, and $w=\{I_A,I_B,I_C,I_N,U_A,U_B,U_C\}$ is the waveforms.

According to the probability distribution of the abnormal event in waveforms of different types, the type of the abnormal event can be judged, i.e. values of $P(\theta_E^x|\psi_E)$ in waveforms of different types are compared and a waveform type corresponding to a maximum value is taken.

One hundred (100) known samples were taken for training, and the event types included single-phase single-cycle early failures, single-phase multi-cycle early failures, interphase short-circuit early failures, transient interferences and permanent failures (which were numbered as 1, 2, 3, 4 and 5, respectively). Another 200 unknown samples were taken for a test and the results are shown in Table 1. It can be seen that the power distribution network early failure detection method based on human-level concept learning provided by the embodiment of the invention has extremely high accuracy and requires less data.

TABLE 1

|  |  | Predicted Type | | | | |
|---|---|---|---|---|---|---|
|  |  | 1 | 2 | 3 | 4 | 5 |
| actual type | 1 | 118 | 0 | 0 | 1 | 2 |
|  | 2 | 0 | 7 | 0 | 1 | 0 |
|  | 3 | 0 | 0 | 5 | 0 | 0 |
|  | 4 | 1 | 3 | 0 | 41 | 1 |
|  | 5 | 1 | 0 | 0 | 1 | 18 |

According to the present invention, voltage and current waveforms, as one of visual concepts, are decomposed into an approximate shape and various distortions, and the overall probability distribution of the waveform can be obtained by calculating probability distribution of each component so as to judge the type of the waveform. The method of the present invention is significantly advanced to conventional detections in terms of required data volume and accuracy. The method of the present invention is of great significance in detection and processing of early failures of power distribution networks.

Specific embodiments of the present invention have been described above. It is to be understood that the invention is not limited to the specific embodiments described above, and that various changes and modifications may be made by those skilled in the art within the scope of the appended claims without departing from the essential contents of the present invention.

We claim:

1. A method for detecting power distribution network early failure, comprising:

(1) decomposing a waveform into an approximation part and detail parts by wavelet transform, wherein the approximation part forms an approximate shape primitive, and the detail parts form a distortion curve are distortion primitives, (2) decomposing the detail parts of the distortion curve into a group of three by dividing the distortion primitive into three distortion primitives including harmonics, pulses, and other distortions based on splitting the distortion curve into a plurality of segments based on extreme points on the distortion curve and combining said plurality of segments with a plurality of neighboring segments based on rules of combination into the group of three distortion primitives, wherein the three distortion primitives are formed to comprise said three distortion primitives of harmonics, pulses, and other distortions, (3) extracting characteristics of the approximate shape primitive and the three distortion primitives and time relationships between the approximate shape primitive and the three distortion primitives and time relationships between the three distortion primitives, (4) constructing probability distribution of the waveform based on a waveform generation process according to the characteristics of the approximate shape primitive and the three distortion primitives and the time relationships between the approximate shape primitive and the three distortion primitives and time relationships between the three distortion primitives by selecting a plurality of selected primitives from a primitives library and combining the selected primitives into a waveform in a sequential order, wherein time relationships between the selected primitives are generated by the sequential order;

(5) comparing waveforms of an abnormal event of a power distribution network and the probability distribution of the waveforms of different types from the construction in step (4), and obtaining a judgment result of the waveform waveforms of the abnormal event according to probability distribution of waveforms of different types; and (6) detecting an early failure of the power distribution network based on the judgment result and actively treating the early failure of the power distribution network by replacing defective equipment associated with the early failure.

2. The method of claim 1, wherein a five-level Meyer function is selected as a wavelet transform function, the approximate shape takes a coefficient $a_5$, distortion curve takes a difference between the waveform and the coefficient $a_5$ in step (1).

3. The method of claim 1, wherein each segment is combined with said plurality of neighboring segments according to the rules of combination that: three or more neighboring segments, which are monotonic in reverse directions and differ in a range of 0.8 to 1.2 times in both amplitude and length of time, form a distortion primitive of harmonics; two neighboring segments, which are monotonic in reverse directions and have an amplitude larger than a threshold and a length of time less than a threshold, form a distortion primitive of pulses; and segments which do not form the distortion primitives of the harmonics and pulses are a distortion primitive of other distortions.

4. The method of claim 3, wherein the threshold for the amplitude is set as 0.5 time as large as an fundamental amplitude; and a threshold for the length of time is set as 0.25 time as long as a fundamental cycle.

5. The method of claim 1, wherein the characteristics of the shape and distortion primitives . . . are extracted according to principles that: for an approximate shape $Z_o$, an amplitude $A_o$, a length of time $T_o$ and a direct-current component $A_{oft}$ of each cycle are extracted; for a harmonic $z_h$, an amplitude $A_h$, a frequency $f_h$ and a total length of time $t_h$ are extracted; for a pulse $z_p$, an amplitude $A_p$ and a pulse width $t_p$ are extracted; and for other distortions $z_{oft}$, no characteristics are extracted in step (3).

6. The method of claim 1, wherein the time relationships between the shape and distortion primitives include time relationships between the approximate shape and the distortions and time relationships between the three distortion primitives the time relationship between the approximate shape and each distortion primitive is referred to as a relative fundamental position $P_o$ and the relative fundamental position $P_0$ indicates a position where the distortion primitive is located on the approximate shape at an initial moment and is represented by a phase angle, the time relationships between the distortion primitives comprise an interval time tint indicating a time interval between two neighboring distortion primitives a single-phase primitive pair $PP_{uni}$ indicating two distortions having same or approximate initial moments in same-phase voltage or current waveforms; and a three-phase primitive pair $PP_{tri}$ indicating three distortion primitives having same or approximate initial moments in three-phase voltage or current waveforms.

7. The method of claim 6, wherein in the time relationships between the approximate shape primitive and the distortion primitives and the time relationships between the distortion primitives, the time relationships associated with the primitive of other distortions are ignored.

8. The method of claim 1, wherein in step (4) the probability distribution of the waveform is constructed according to a formula of:

$$P(\theta_w^x \mid \psi_w) = P(\mu^{(x)})P(\sigma^{(x)})P(\kappa^{(x)} \mid \kappa)\prod_i^\kappa P(z_i^{(x)} \mid z_i)P(p_i^{(x)} \mid p_i)P(R_i^{(x)} \mid R_i)$$

wherein $\theta_w^x$ is an unknown waveform case, $\psi_w$ is a known waveform type, noises obey normal distribution $S_N \sim N(\mu, \sigma^2)$, $\kappa$ is the number of the selected primitives, $z=\{z_o, z_h, z_p, z_{other}\}$ is the selected primitive types, P is characteristic parameters of the selected primitives, and R is the time relationships between the selected primitives; three-phase currents recorded in the abnormal event of the power distribution network are summed to obtain a neutral point current to generate seven waveforms $(I_A, I_B, I_C, I_N, U_A, U_B, U_C)$ of different types, and probability distribution of the abnormal event in the waveforms of different types is obtained according to a formula of:

$$P(\theta_E^x \mid \psi_E) = \prod_{i=1}^{7} P(\theta_{wi}^x \mid \psi_{wi})$$

wherein, $\theta_E^x$ is an unknown event case, $\psi_E$ is a known event type, and $w=\{I_A, I_B, I_C, I_N, U_A, U_B, U_C\}$ is the waveforms.

9. The method of claim 8, wherein a type of the abnormal event is judged according to the probability distribution of the abnormal event in the waveforms of different types including values of $P(\theta_E^x \mid \psi_E)$ in waveforms of different types are compared, and a waveform type corresponding to a maximum value is taken as to obtain the judgment result of the waveform in step (5).

* * * * *